(12) United States Patent
Chi (10) Patent No.: US 10,283,171 B2
(45) Date of Patent: May 7, 2019

(54) STACKED DIE SEMICONDUCTOR DEVICE WITH SEPARATE BIT LINE AND BIT LINE BAR INTERCONNECT STRUCTURES

(71) Applicant: TAIWAN SEMICONDUCTOR MANUFACTURING COMPANY, LTD., Hsinchu (TW)

(72) Inventor: Shyh-An Chi, Hsinchu (TW)

(73) Assignee: TAIWAN SEMICONDUTOR MANUFACTURING COMPANY, LTD., Hsinchu (TW)

( * ) Notice: Subject to any disclaimer, the term of this patent is extended or adjusted under 35 U.S.C. 154(b) by 305 days.

(21) Appl. No.: 14/673,108

(22) Filed: Mar. 30, 2015

(65) Prior Publication Data
US 2016/0293227 A1    Oct. 6, 2016

(51) Int. Cl.
*G11C 5/02* (2006.01)
*G11C 5/06* (2006.01)

(52) U.S. Cl.
CPC .............. *G11C 5/063* (2013.01); *G11C 5/025* (2013.01)

(58) Field of Classification Search
CPC ........... G11C 5/063; G11C 5/025; G11C 5/04; G11C 5/06; G11C 7/18
USPC ........ 365/51, 52, 63, 230.03, 154, 156, 148; 257/773, 734, 330
See application file for complete search history.

(56) References Cited

U.S. PATENT DOCUMENTS

| | | | |
|---|---|---|---|
| 5,835,396 A | 11/1998 | Zhang | |
| 5,973,953 A | 10/1999 | Yamashita et al. | |
| 7,420,832 B1 * | 9/2008 | Lukes | G11C 5/025 365/63 |
| 8,097,947 B2 * | 1/2012 | Lua | H01L 21/563 257/734 |
| 8,106,449 B2 * | 1/2012 | Sano | H01L 27/11 257/330 |
| 8,238,134 B2 * | 8/2012 | Matsui | G11C 5/00 365/63 |
| 8,437,163 B2 * | 5/2013 | Nakanishi | G11C 5/02 365/230.03 |
| 8,448,100 B1 | 5/2013 | Lin et al. | |
| 8,472,232 B2 * | 6/2013 | Silvestri | G11C 5/02 365/63 |
| 8,631,372 B2 | 1/2014 | Yu et al. | |
| 8,669,780 B2 | 3/2014 | Chi | |
| 8,701,073 B1 | 4/2014 | Fu et al. | |
| 8,737,108 B2 * | 5/2014 | Saraswat | G11C 7/10 365/63 |
| 8,754,818 B2 | 6/2014 | Yen et al. | |
| 8,760,910 B2 * | 6/2014 | Tang | G11C 13/0007 365/63 |
| 8,971,087 B2 * | 3/2015 | Vogt | G11C 5/06 365/63 |
| 9,036,402 B2 * | 5/2015 | Sandhu | G11C 13/0007 365/63 |
| 9,070,442 B2 * | 6/2015 | Yip | G11C 16/02 |
| 9,147,438 B2 * | 9/2015 | Kamal | G06F 1/3225 |
| 9,171,849 B2 * | 10/2015 | Chan | G11C 11/419 |

(Continued)

*Primary Examiner* — David Lam
(74) *Attorney, Agent, or Firm* — Hauptman Ham, LLP (57) ABSTRACT

An apparatus includes a first tier, a second tier and a memory. The second tier is vertically stacked on the first tier. The memory includes a column of memory bit cells. A first portion of the column of memory bit cells is on the first tier. A second portion of the column of memory bit cells is on the second tier.

20 Claims, 4 Drawing Sheets

(56) References Cited

U.S. PATENT DOCUMENTS

| | | | |
|---|---|---|---|
| 9,202,557 B2* | 12/2015 | Wang | G11C 11/412 |
| 9,208,854 B2* | 12/2015 | Lin | G11C 5/025 |
| 9,299,391 B2* | 3/2016 | Yang | G11C 5/025 |
| 9,514,792 B2* | 12/2016 | Kajigaya | G11C 7/18 |
| 9,524,920 B2* | 12/2016 | Lin | H01L 23/481 |
| 2008/0310207 A1* | 12/2008 | Tan | G11C 5/025 |
| | | | 365/51 |
| 2011/0032751 A1* | 2/2011 | Funane | G11C 8/16 |
| | | | 365/156 |
| 2012/0320698 A1 | 12/2012 | Itagaki et al. | |
| 2013/0193981 A1 | 8/2013 | Chen et al. | |
| 2013/0246990 A1 | 9/2013 | Yen et al. | |
| 2013/0320553 A1 | 12/2013 | Kuo et al. | |
| 2014/0043148 A1 | 2/2014 | Wang et al. | |
| 2014/0077057 A1 | 3/2014 | Chao et al. | |
| 2014/0092939 A1 | 4/2014 | Chang et al. | |
| 2014/0126089 A1 | 5/2014 | Chang et al. | |
| 2014/0126274 A1 | 5/2014 | Lee et al. | |
| 2014/0167799 A1 | 6/2014 | Wang et al. | |
| 2014/0195728 A1 | 7/2014 | Hsu et al. | |
| 2014/0203397 A1 | 7/2014 | Yen et al. | |
| 2014/0211438 A1 | 7/2014 | Lin et al. | |
| 2014/0239427 A1 | 8/2014 | Huang et al. | |
| 2014/0241090 A1 | 8/2014 | Chen et al. | |
| 2014/0264772 A1 | 9/2014 | Horng et al. | |
| 2014/0266273 A1 | 9/2014 | Wang et al. | |
| 2015/0063039 A1* | 3/2015 | Chen | G11C 29/04 |
| | | | 365/189.02 |
| 2015/0130068 A1* | 5/2015 | Lin | H01L 23/481 |
| | | | 257/773 |
| 2016/0027477 A1* | 1/2016 | Petti | G11C 5/02 |
| | | | 365/51 |

* cited by examiner

STACKED DIE SEMICONDUCTOR DEVICE WITH SEPARATE BIT LINE AND BIT LINE BAR INTERCONNECT STRUCTURES

FIELD OF DISCLOSURE

The present disclosure is related to integrated circuits (IC) and, more particularly, to a stacked die semiconductor device configured as a memory circuit.

BACKGROUND

A recent trend in semiconductor memories is to fabricate three dimensional (3D) integrated circuits (3D IC). 3D ICs include a variety of structures, such as die on silicon interposer, stacked dies, multi-tiered, stacked CMOS structures, or the like. These 3D circuits offer a lot of advantages over traditional two dimensional circuits, such as lower power consumption, higher memory cell density, greater efficiency, alleviating bottlenecks, shorter critical path delays, and/or lower area cost. Stacked die 3D ICs are constructed by vertically stacking two dimensional chips and providing power and signal communication connections between the chips (for example, using through-substrate vias (TSVs). Alternatively, 3D IC can be constructed using a single die with integrated components arranged in three dimensions into a plurality of tiers. Each tier can have its own active device layer and/or interconnect structure. Two adjacent tiers are separated from each other by an insulating layer or thin semiconductor substrate or layer. In some applications, the performance of these 3D ICs is limited by the performance variation of the worst-performing die or tier in the vertical stack.

DETAILED DESCRIPTION

Making and using various embodiments of the disclosure are discussed in detail below. It should be appreciated, however, that the embodiments provide many applicable inventive innovations that can be embodied in a wide variety of specific contexts. The specific embodiments discussed are merely illustrative, and do not limit the scope of the disclosure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, unless expressly described otherwise.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

Static random access memory (SRAM) is a type of semiconductor memory that uses bi-stable circuitry to form a memory bit cell. Dynamic random access memory (DRAM) is another type of semiconductor memory in which each memory bit cell includes a capacitor and a transistor. Each memory bit cell stores a single bit and is accessed by two types of conductive lines: bit lines (BL) and word lines (WL). When reading selected memory bit cells, a row of memory bit cells are identified by a word line, pre-charge voltages are applied and the bit values are transferred from the identified memory bit cell to the bit lines creating a small voltage difference across the bit lines. Sense amplifiers measure this small voltage difference across the bit lines and translate it to a full logic signal that may be used in digital logic.

In some embodiments, memory circuits, like SRAM and DRAM circuits, are formed on a semiconductor substrate and referred to as a memory die. These memory dies can be used to form three dimensional (3D) memory circuits by vertically stacking the dies through bump pads and providing power and signal communication connections between the dies using through substrate via (TSV). Each die is called a tier of the 3D memory circuit.

Alternatively, 3D memory circuits can be constructed using a single semiconductor wafer, with integrated components arranged in three dimensions. In a single-substrate 3D IC (such as a stacked CMOS 3D IC or a monolithic 3D IC), components are also arranged into tiers, each tier having a plurality of layers. Each tier has a respective interconnect structure, and optionally has a respective active device layer. A respective insulating layer or semiconductor layer is provided between two adjacent tiers. Inter-layer vias (ILV) are used to interconnect between different tiers.

For example, the first tier includes the semiconductor substrate with active devices thereon, and an interconnect structure including conductive line layers and conductive via layers. A thin semiconductor substrate can be directly disposed over the top conductive line layer of the first tier. Active devices (e.g., transistors, diodes, MOS capacitors, or varactors) are formed in the thin semiconductor substrate of the second tier. A second tier interconnect structure is formed over the thin semiconductor substrate of the second tier. The second tier interconnect structure includes second tier conductive line layers and second tier conductive via layers. Inter-layer vias may couple metal lines in the second tier conductive line layers with other metal lines in the first tier conductive line layers.

During the fabrication of dies with memory blocks, variation in transistor, capacitor, and resistor attributes—due to process variations—results in output performance variance which degrades the overall die performance. The process variations mentioned above may be shown in dies of the same or different manufacture lots. This variance is a particular challenge in three dimensional (3D) memory circuits because the 3D memory circuit's output performance is limited by the worst- or least-performing tiers or dies. Since each die or tier of the 3D memory circuits is fabricated separately, the impact of process variation can be magnified, compared with two dimensional (2D) memory circuits.

Figure 1:
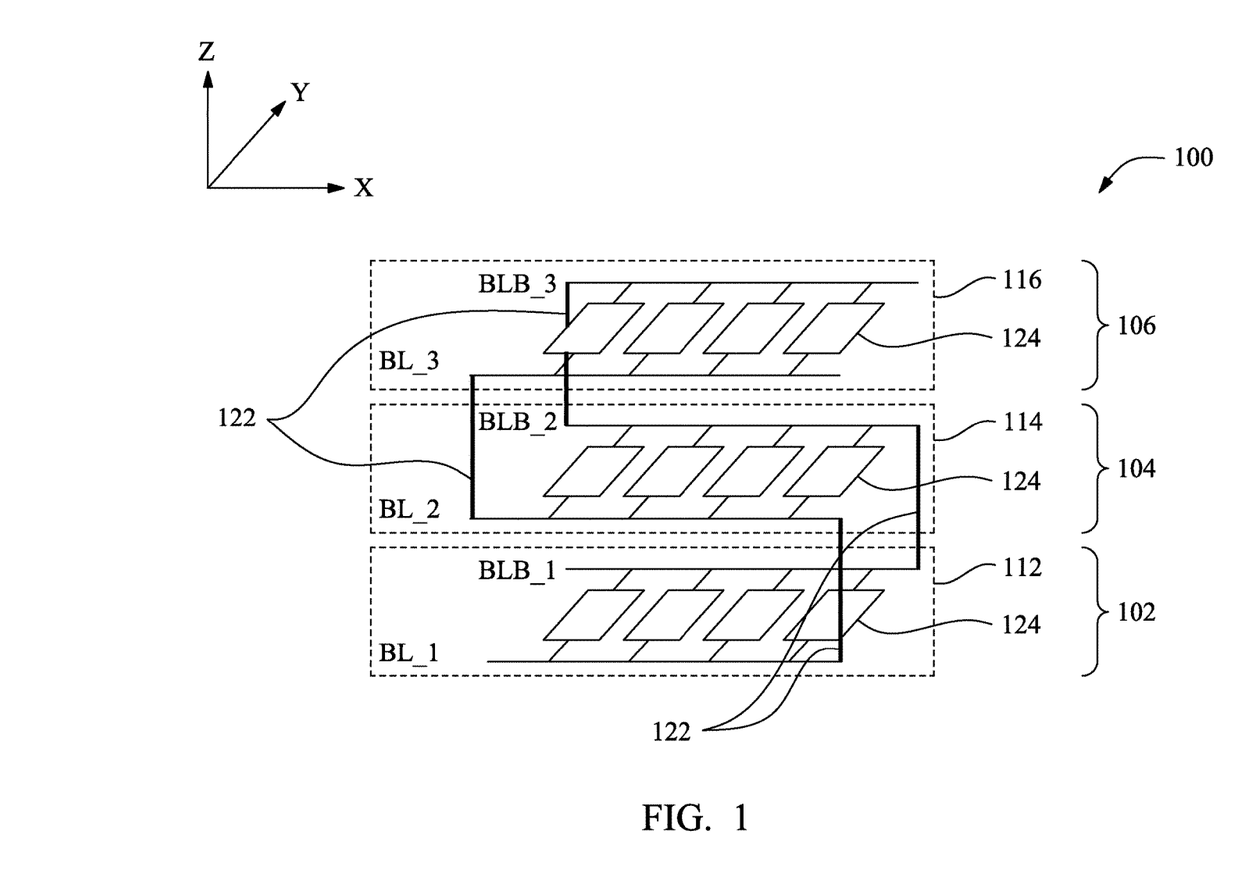
FIG. 1 is a perspective view of a 3D bit line layout 100 in a memory slice in accordance with some embodiments.

FIG. 1 is a schematic view of a 3D bit line layout 100 in a memory slice according to some example embodiments. In some embodiments, the 3D bit cell layout 100 represents a column of memory bit cells. In some embodiments, the 3D bit cell layout 100 represents a portion of a column of memory bit cells. In some embodiments, the memory slice represents a stack of memory cells. The 3D bit line layout 100 includes three segments 112-116 and interconnection structures 122. The three segments 112-116 are arranged to implement in three tiers 102-106, respectively. The tier 104 is disposed vertically above the tier 102. The tier 106 is disposed vertically above the tier 104.

The terms "tier" and "die" are used interchangeably in this disclosure and such use should not limit the scope of the claims appended herewith.

In some embodiments, the memory is static random access memory (SRAM), dynamic random access memory (DRAM), magnetoresistive random access memory (MRAM), resistance random access memory (RRAM), ferroelectric random access memory (ReRAM), etc.

The segment 112 includes a first bit line BL_1 and a second bit line BLB_1 that are extended in a direction X. The designator "BL" refers to "bit line" and the designator "BLB" refers to "bit line bar". The segment 114 includes a first bit line BL_2 and a second bit line BLB_2. The segment 116 includes a first bit line BL_3 and a second bit line BLB_3. A plurality of memory bit cells 124 is disposed between and coupled to the first bit lines BL_1, BL_2 and BL_3 and the second bit lines BLB_1, BLB_2 and BLB_3, respectively. For simplicity purpose, only three bit cells 124 are labeled.

There is one interconnection structure 122 coupled with the first bit lines BL_1 and BL_2. Similarly, there is one interconnection structure 122 coupled with the first bit lines BL_2 and BL_3. Moreover, there is one interconnection structure 122 coupled with the second bit lines BLB_1 and BLB_2. Similarly, there is one interconnection structure 122 coupled with the first bit lines BLB_2 and BLB_3. Although the interconnection structures 122 are arranged to dispose between the ends of vertical adjacent two of the bit lines in FIG. 1, it is understood that the interconnection structures 122 may be disposed at any location of the corresponding two bit lines. For example, the interconnection structure 122 between the first bit lines BL_1 and BL_2 can be disposed at the middle position of the first bit lines BL_1 and BL_2.

In some embodiments, the first bit lines and the second bit lines include metal lines, vias, redistribution layer (RDL), inter-layer vias, through substrate vias, and/or solder ball, etc. In some embodiments, at least one of the interconnection structures 122 includes inter-layer via. In some embodiments, at least one of the interconnection structures 122 is an inter-layer via. In some embodiments, at least one of the interconnection structures 122 further includes metal lines and/or vias. In some embodiments, at least one of the interconnection structures 122 includes through substrate via, metal lines, vias, and/or solder ball. In some embodiments, the interconnection structures 122 are arranged to extend in a direction Z that is perpendicular to the first bit lines and the second bit lines. In some embodiments, a portion of a bit line of a column of memory bit cells is arranged to extend in a direction X, another portion of a bit line of a column of memory bit cells is arranged to extend in a direction Z.

In some embodiments, the first bit lines BL_1, BL_2, BL_3 and corresponding coupled interconnection structures are disposed within a first vertical plane in X-Z plane. The second bit lines BLB_1, BLB_2, BLB_3 and corresponding coupled interconnection structures are disposed within a second vertical plane in X-Z plane.

In some embodiments, the bit lines and corresponding coupled interconnection structures in the same vertical plane are arranged to form an "S" shape. For example, the first bit lines BL_1, BL_2, BL_3 and corresponding coupled interconnection structures 122 form an "S" shape. In some embodiments, the bit lines and corresponding coupled interconnection structures are arranged to form an "E" shape. In some embodiments, the bit lines and corresponding coupled interconnection structures are arranged to form a "C" shape. In some embodiments, the bit lines and corresponding coupled interconnection structures are arranged to form a cross shape.

In some embodiments, each segment of the segments 112-116 has an equal number of bit cells 124. In some embodiments, at least one segment of the segments 112-116 has a different number of bit cells 124 comparing with the other segments. In some embodiments, vertically stacked segments 112-116 are substantially aligned with each other. For example, the first bit line BL_2 is vertically above the first bit line BL_1. For another example, the bit cells in the segment 114 are arranged to dispose vertically above the bit cells in the segment 112.

Figure 2:
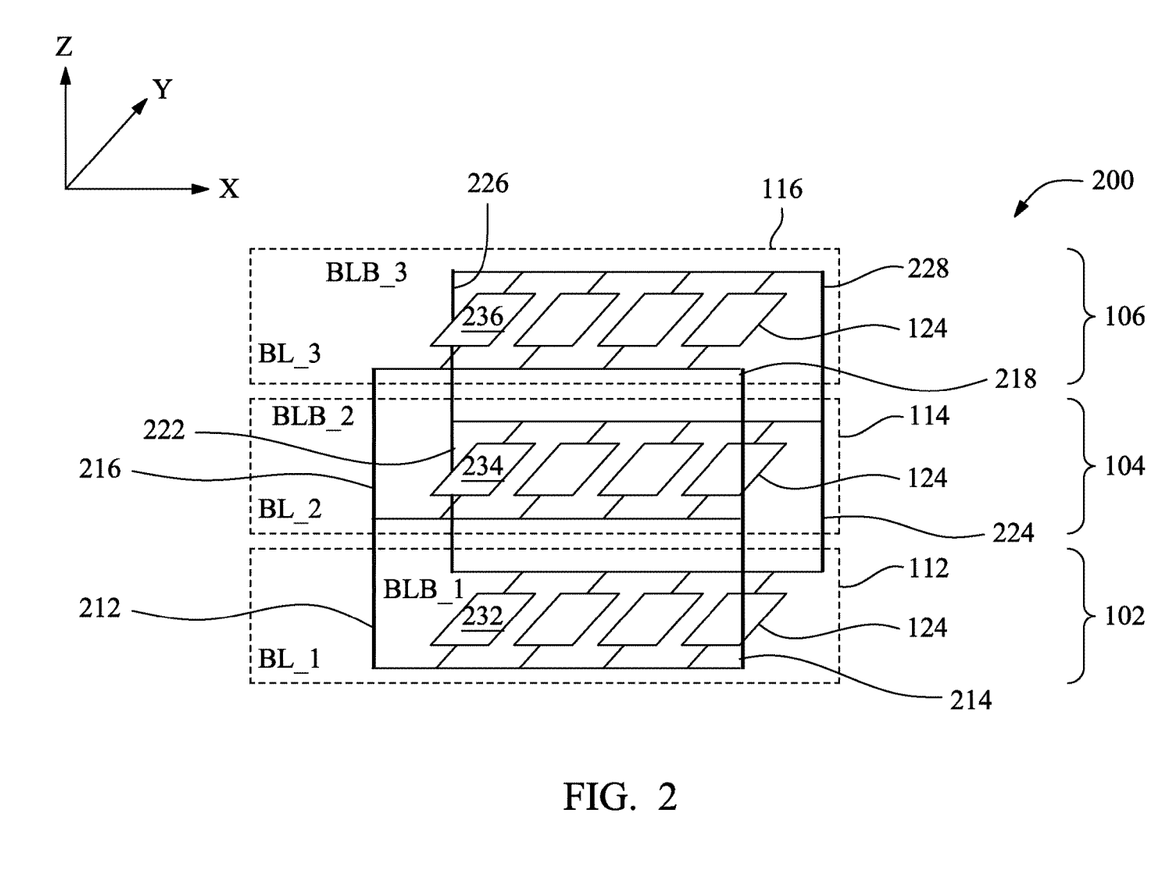
FIG. 2 is a perspective view of a 3D bit line layout 200 in a memory slice in accordance with some embodiments.

FIG. 2 is a schematic view of a 3D bit line layout 200 in a memory slice according to some example embodiments. In some embodiments, the bit cell layout 200 represents a column of memory bit cells. In some embodiments, the 3D bit cell layout 200 represents a portion of a column of memory bit cells. The bit line layout 200 is similar to the bit line layout 100 in FIG. 1 except for interconnection structures 212-218 and interconnection structures 222-228. With respect to the embodiment of FIG. 1, like elements in the bit cell layout 200 are designated with the same reference numbers for ease of understanding.

There are two interconnection structures 212 and 214 coupled with the first bit lines BL_1 and BL_2. Similarly, there are two interconnection structures 216 and 218 coupled with the first bit lines BL_2 and BL_3. Moreover, there are two interconnection structures 222 and 224 coupled with the second bit lines BLB_1 and BLB_2. Similarly, there are two interconnection structures 226 and 228 coupled with the first bit lines BLB_2 and BLB_3. Although the interconnection structures 212-218 and 222-228 are arranged to dispose between the ends of vertical adjacent two of the bit lines in FIG. 2, it is understood that the interconnection structures may be disposed at any location of the corresponding two bit lines.

In some embodiments, at least one of the interconnection structures 212-218 and 222-228 is an inter-layer via. In some embodiments, at least one of the interconnection structures 212-218 and 222-228 includes an inter-layer via. In some embodiments, at least one of the interconnection structures 212-218 and 222-228 includes inter-layer via, metal lines, and/or vias. In some embodiments, at least one of the interconnection structures 212-218 and 222-228 include through substrate via, metal lines, vias, and/or solder ball. In some embodiments, the interconnection structures 212-218 and 222-228 are arranged to extend in a direction Z that is perpendicular to the first bit lines and the second bit lines. In some embodiments, a portion of a bit line of a column of memory bit cells is arranged to extend in a direction X, another portion of a bit line of a column of memory bit cells is arranged to extend in a direction Z.

In some embodiments, the first bit lines BL_1, BL_2, BL_3 and interconnection structures 212-218 are disposed within a third vertical plane in X-Z plane. The second bit lines BLB_1, BLB_2, BLB_3 and interconnection structures 222-228 are disposed within a fourth vertical plane in X-Z plane.

In some embodiments, the bit lines and corresponding coupled interconnection structures in the same vertical plane are arranged to form one or multiple quadrangles. For example, the first bit lines BL_1, BL_2 and corresponding coupled interconnection structures 212, 214 form a quadrangle in the third vertical plane. Moreover, the first bit lines BL_2, BL_3 and corresponding coupled interconnection structures 216, 218 form another quadrangle in the third vertical plane. Similarly, the second bit lines BLB_1, BLB_2 and corresponding coupled interconnection structures 222, 224 form a quadrangle in the fourth vertical plane. Moreover, the second bit lines BLB_2, BLB_3 and corresponding coupled interconnection structures 226, 228 form another quadrangle in the fourth vertical plane.

In some embodiments, there are more than two interconnection structures between two vertically adjacent bit lines in the same vertical plane. In some embodiments, the number of interconnection structures between the first bit lines BL_1 and BL_2 and the number of interconnection structures between the first bit lines BL_2 and BL_3 are the same in the third vertical plane. In such a situation, the number of the quadrangles formed between the first bit lines BL_1 and BL_2 and the number of the quadrangles formed between the first bit lines BL_2 and BL_3 are the same.

In some embodiments, the number of interconnection structures between the first bit lines BL_1 and BL_2 and the number of interconnection structures between the first bit lines BL_2 and BL_3 are different in the third vertical plane. In such a situation, the number of the quadrangles formed between the first bit lines BL_1 and BL_2 and the number of the quadrangles formed between the first bit lines BL_2 and BL_3 are different.

In some embodiments, the number of interconnection structures between the second bit lines BLB_1 and BLB_2 and the number of interconnection structures between the second bit lines BLB_2 and BLB_3 are the same in the fourth vertical plane. In such a situation, the number of the quadrangles formed between the second bit lines BLB_1 and BLB_2 and the number of the quadrangles formed between the second bit lines BLB_2 and BLB_3 are the same.

In some embodiments, the number of interconnection structures between the second bit lines BLB_1 and BLB_2 and the number of interconnection structures between the second bit lines BLB_2 and BLB_3 are different in the fourth vertical plane. In such a situation, the number of the quadrangles formed between the second bit lines BLB_1 and BLB_2 and the number of the quadrangles formed between the second bit lines BLB_2 and BLB_3 are different.

In some embodiments, the number of interconnection structures in the third vertical plane is the same as the number of interconnections in the fourth vertical plane. In such a situation, the number of quadrangles formed in the third vertical plane is the same as the number of quadrangles formed in the fourth vertical plane.

In some embodiments, the number of interconnection structures in the third vertical plane is different from the number of interconnection structures in the fourth vertical plane. In such a situation, the number of quadrangles formed in the third vertical plane is different from the number of quadrangles formed in the fourth vertical plane.

Figure 3:
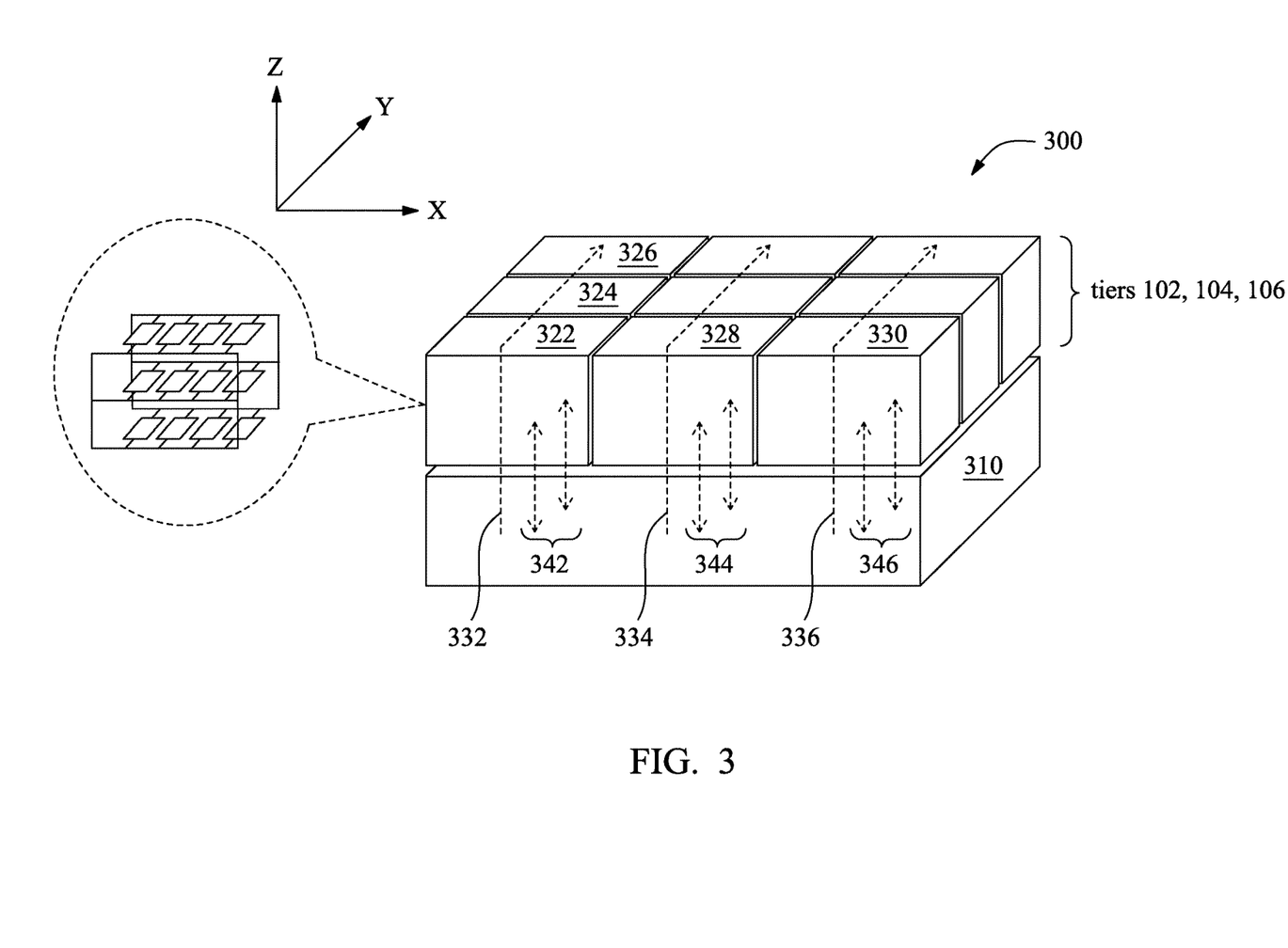
FIG. 3 is a perspective view showing a three dimensional structure of a stacked memory device 300 in accordance with some embodiments.

FIG. 3 is a schematic view showing a three dimensional structure of a stacked memory device 300 according to some example embodiments. The stacked memory device 300 includes a peripheral die 310, word lines 332-336, BL-BLB pairs 342-346 and a plurality of memory slices. For simplicity purpose, only five memory slices 322-330 are labeled. Each of the plurality of memory slices is similar to the memory slice 100 or the memory slice 200 in FIG. 1 or FIG. 2, respectively. Although FIG. 3 only shows nine memory slices, it is understood that any number of memory slices in the stacked memory device 300 is within the scope of various embodiments.

The peripheral die 310 is configured to generate word lines 332-336 and BL-BLB pairs 342-346. In some embodiments, the peripheral die 310 includes a row decoder, a column decoder, sense amplifiers, and an input/output buffer (not shown for simplicity). The row decoder receives a portion of memory cell addresses from an external interface (not shown) to generate corresponding word line signals on the word lines. The column decoder receives another portion of memory cell addresses from the external interface to couple selected BL-BLB pairs to external interface through the sense amplifiers and the input/output buffer. FIG. 3 only shows three word lines and three BL-BLB pairs for simplicity, it is understood that any number of word lines and BL-BLB pairs in the stacked memory device 300 is within the scope of various embodiments.

In some embodiments, each of the word lines 332-336 labeled in FIG. 3 represents a plurality of word lines in corresponding dies to couple to memory bit cells in each of the memory slices. For example, the word line 332 represents a first word line, a second word line and a third word line. The first word line of the word line 332 couples with a memory bit cell 232 in FIG. 2 of the memory slice 322, a memory bit cell 232 in FIG. 2 of the memory slice 324 and a memory bit cell 232 in FIG. 2 of the memory slice 326 in the tier 102. The second word line of the word line 332 couples with a memory bit cell 234 in FIG. 2 of the memory slice 322, a memory bit cell 234 in FIG. 2 of the memory slice 324 and a memory bit cell 234 in FIG. 2 of the memory slice 326 in the tier 104. The third word line of the word line 332 couples with a memory bit cell 236 in FIG. 2 of the memory slice 322, a memory bit cell 236 in FIG. 2 of the memory slice 324 and a memory bit cell 236 in FIG. 2 of the memory slice 326 in the tier 106.

In some embodiments, for each of the memory slices in the stacked memory device 300, there is at least one corresponding BL-BLB pair couples to the first bit line in the first vertical plane and the second bit line in the second vertical plane, respectively. For example, in the memory slice 322, the BL-BLB pair 342 couples to the first bit line BL_1 in the first vertical plane in FIG. 2 and the second bit line BLB_1 in the second vertical plane in FIG. 2, respectively. In the memory slice 328, the BL-BLB pair 344 couples to the first bit line BL_1 in the first vertical plane in FIG. 2 and the second bit line BLB_1 in the second vertical plane in FIG. 2, respectively. In the memory slice 330, the BL-BLB pair 346 couples to the first bit line BL_1 in the first vertical plane in FIG. 2 and the second bit line BLB_1 in the second vertical plane in FIG. 2, respectively.

In some embodiments, each of the word lines 332-336 may includes metal lines and vias in the peripheral die 310 and the tiers 102-106, TSVs and/or ILVs in the tiers 102-106, bump pads and solder balls (not shown) between the tiers 102-106 and the peripheral die 310. For example, the first word line of the word line 332 is arranged to in sequence couple through metal lines and vias in the peripheral die 310, bump pads and solder balls between the tiers 102 and the peripheral die 310, TSVs, metal lines and vias in the tier 102 to the corresponding memory bit cells in the tier 102. For another example, the first word line of the word line 332 is arranged to in sequence couple through metal lines and vias in the peripheral die 310, inter-layer vias, metal lines and vias in the tier 102 to the corresponding memory bit cells in the tier 102.

In some embodiments, each of the word lines 332-336 includes a first segment and a second segment. The first segment of each of the word lines 332-336 is disposed to extend in the direction Z from the peripheral die 310 to a corresponding tier. The second segment of each of the word lines 332-336 is disposed to extend in the direction Y in that corresponding tier. In some embodiments, each of the BL-BLB pairs 342-346 is disposed to extend in the direction Z from the peripheral die 310 to the tiers 102-106.

In some embodiment, the first segment of each of the word lines 332-336 is in parallel with each of the BL-BLB pairs 342-346 in the stacked memory device 300. In some embodiments, the second segment of each of the word lines 332-336 is perpendicular to each of the BL-BLB pairs 342-346 in the stacked memory device 300. In some embodiment, the first segment of at least one of the word lines 332-336 is in parallel with at least one of the BL-BLB pairs 342-346 in the stacked memory device 300. In some embodiments, the second segment of at least one of the word lines 332-336 is perpendicular to at least one of the BL-BLB pairs 342-346 in the stacked memory device 300.

In some embodiments, each of the memory slices in the stacked memory device 300 represents a column of memory bit cells of the stacked memory device 300. In some embodiments, at least two of the memory slices in the stacked memory device 300 represent a column of memory bit cells of the stacked memory device 300. For example, the memory slices 322 and 328 represent a column of memory bit cells. In such a situation, the first bit lines BL_1-BL_3 in FIG. 2 of the memory slice 322 are coupled with the first bit lines BL_1-BL_3 of the memory slice 328 in the tiers 102-106, respectively. Similarly, the second bit lines BLB_1-BLB_3 in FIG. 2 of the memory slice 322 are coupled with the first bit lines BLB_1-BLB_3 of the memory slice 328 in the tiers 102-106, respectively.

Figure 4:
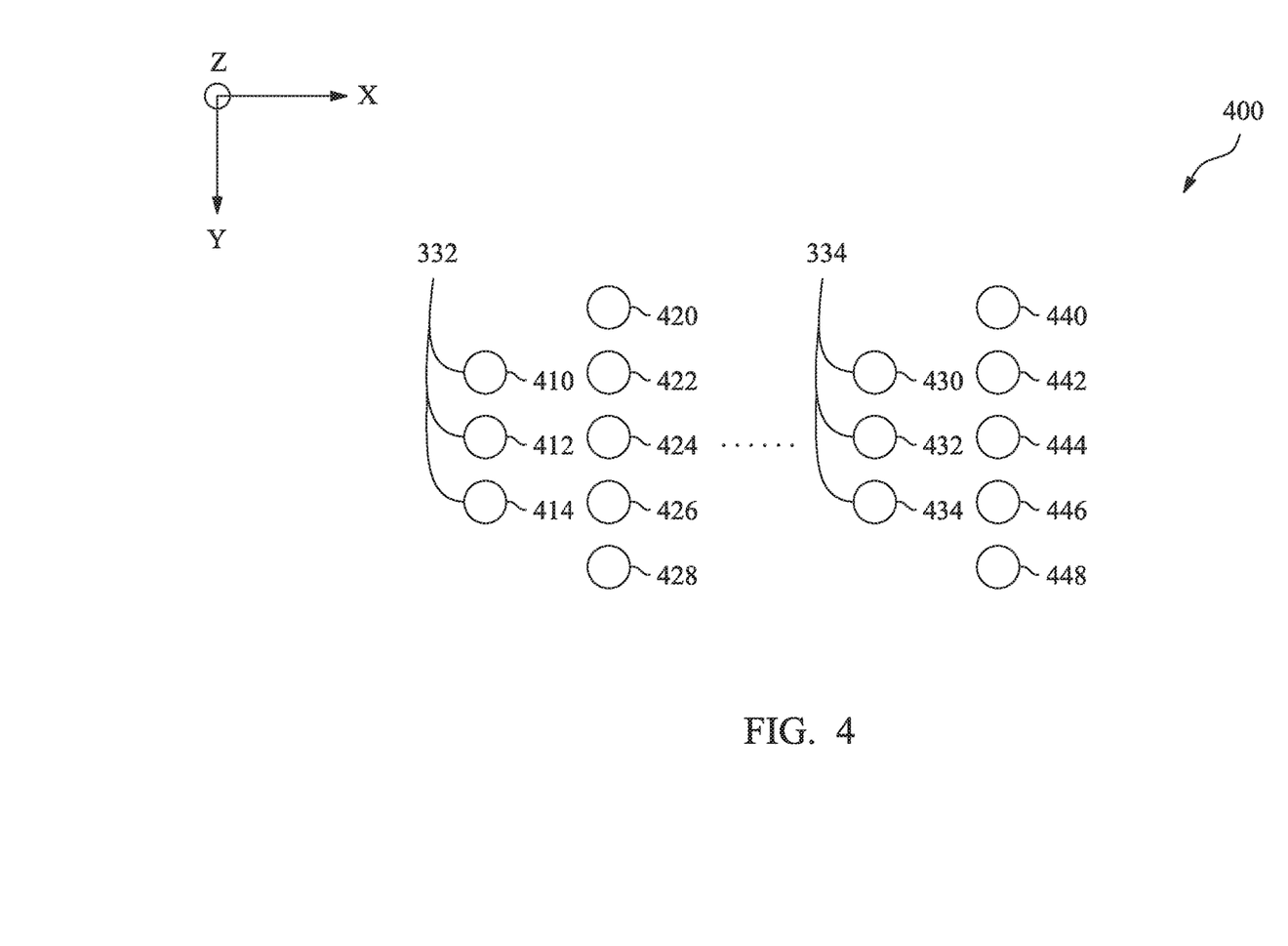
FIG. 4 is a fragment view of conductive connection patterns 400 in accordance with some embodiments.

FIG. 4 is a fragment view of conductive connection patterns 400 according to some example embodiments. In some embodiments, the conductive connection patterns 400 are bump patterns or footprints. In such a situation, the conductive connection patterns 400 are arranged to dispose correspondingly on an upper surface of the peripheral die 310 and a lower surface of the tier 102 in FIG. 3 such that these two dies can joint and communicate with each other. In some embodiments, the conductive connection patterns 400 include bumps for word lines, BL-BLB pair, power and ground, etc.

For example, the bumps 410-414 are for the word line 332 in FIG. 3 such that the bump 410 is for the first word line of the word line 332, the bump 412 is for the second word line of the word line 332 and the bump 414 is for the third word line of the word line 332. For another example, the bumps 430-434 are for the word line 334 in FIG. 3 such that the bump 430 is for the first word line of the word line 334, the bump 432 is for the second word line of the word line 334 and the bump 434 is for the third word line of the word line 334.

In some embodiments, bumps for BL-BLB pair and power/ground are interleaved and disposed along the direction Y. For example, bumps 422 and 426 are for BL-BLB pair 342 of the memory slice 322 in FIG. 3, bumps 420, 424 and 428 are for powers and/or grounds, respectively. For another example, bumps 442 and 444 are for BL-BLB pair 344 of the memory slice 328 in FIG. 3, bumps 440, 446 and 448 are for powers and/or grounds, respectively.

In some embodiments, bumps of BL-BLB pair are sandwiched by bumps of word lines in a direction X. For example, the bumps 422, 426 of BL-BLB pair 342 are sandwiched by the bump 410-414, 430-434 of the word lines 332-334 in FIG. 3. In some embodiments, bumps of word lines are sandwiched by bumps of BL-BLB pair in a direction X. For example, the bumps 430-434 of the word line 334 in FIG. 3 are sandwiched by the bumps 422, 426 and the bumps 442, 444 of the BL-BLB pairs 342,344, respectively.

In some embodiments, bumps of BL-BLB pair are sandwiched by bumps of powers and/or grounds in a direction Y. In some embodiments, bumps of powers and/or grounds are sandwiched by bump of BL of the BL-BLB pair and bump of BLB of the BL-BLB pair in a direction Y. In some embodiments, bumps of powers and/or grounds are sandwiched by bumps of two different BL-BLB pairs in a direction Y.

In some embodiments, the peripheral die 310 and the tiers 102-106 are stacked in a way of stacked CMOS 3D IC or monolithic 3DIC. In such a situation, the conductive connection patterns 400 are a fragment of cross-sectional plane view of inter-layer vias at the lower surface of the tier 102. For example, inter-layer vias of the word line 332 in FIG. 3 are transmitted from the peripheral die 310 in FIG. 3 through the conductive connection patterns 410-414 to corresponding dies 102-106.

In some embodiments, an apparatus includes a first tier, a second tier and a memory. The second tier is vertically stacked on the first tier. The memory includes a column of memory bit cells. A first portion of the column of memory bit cells is on the first tier. A second portion of the column of memory bit cells is on the second tier In some embodiments, an apparatus includes a first tier, a second tier, a column of memory bit cells, a first bit line and a first bit line bar, and a second bit line and a second bit line bar. The second tier is vertically stacked on the first tier. The first bit line and a first bit line bar are in the first tier. The second bit line and a second bit line bar are in the second tier. A first portion of the column of memory bit cells is coupled to the first bit line and the first bit line bar. A second portion of the column of memory bit cells is coupled to the second bit line and the second bit line bar.

In some embodiments, an apparatus includes a peripheral tier, a first tier, a second tier, and a plurality of memory slices. The first tier and the second tier are vertically stacked on the peripheral tier. Each of the plurality of memory slices includes a first portion of a column of memory bit cells. The first portion of the column of memory bit cells is in the first tier. Each of the plurality of memory slices further includes a second portion of a column of memory bit cells. The second portion of the column of memory bit cells is in the second tier. The peripheral tier is configured to generate a BL-BLB pair. The BL-BLB pair couples to at least one of the plurality of memory slices While the disclosure has been described by way of examples and in terms of disclosed embodiments, the invention is not limited to the examples and disclosed embodiments. To the contrary, various modifications and similar arrangements are covered as would be apparent to those of ordinary skill in the art. Therefore, the scope of the appended claims should be accorded the broadest interpretation so as to encompass such modifications and arrangements.

What is claimed is:

1. An apparatus, comprising:
a first tier on a first substrate;
a second tier on a second substrate, wherein the second tier is vertically stacked on the first tier; and
a memory comprising a column of memory bit cells, wherein
a first portion of the column of memory bit cells is on the first tier;
a second portion of the column of memory bit cells is on the second tier;
the first portion of the column of memory bit cells is coupled with a first segment of a first bit line; and
the second portion of the column of memory bit cells is coupled with a second segment of the first bit line.

2. The apparatus of claim 1, wherein a number of memory bit cells of the first portion of the column of memory bit cells is the same as a number of memory bit cells of the second portion of the column of memory bit cells.

3. The apparatus of claim 1, wherein
the first portion of the column of memory bit cells is coupled with a first segment of a second bit line in the first tier; and
the second portion of the column of memory bit cells is coupled with a second segment of the second bit line in the second tier.

4. The apparatus of claim 3, wherein at least one interconnection structure includes a conductive bump which couples with the first segment of the first bit line and the second segment of the first bit line, such that the-at least one interconnection structure, the first segment of the first bit line and the second segment of the first bit line form a "C" shape.

5. The apparatus of claim 3, wherein at least two interconnection structures couple with the first segment of the first bit line and the second segment of the first bit line, such that the at least two interconnection structures, the first segment of the first bit line and the second segment of the first bit line form at least one quadrangle.

6. The apparatus of claim 3, wherein the second segment of the first bit line is vertically above the first segment of the first bit line.

7. The apparatus of claim 1, wherein at least one memory bit cell of the first portion of the column of memory bit cells is vertically below at least one memory bit cell of the second portion of the column of memory bit cells.

8. An apparatus, comprising:
a first tier on a first substrate;
a second tier on a second substrate and vertically stacked on the first tier; and
a column of memory bit cells;
a first bit line and a first bit line bar in the first tier; and
a second bit line and a second bit line bar in the second tier;
wherein
the second bit line is electrically coupled to the first bit line by at least one interconnection structure that includes a conductive bump to electrically connect the first substrate to the second substrate;
a first portion of the column of memory bit cells are coupled to the first bit line and the first bit line bar; and
a second portion of the column of memory bit cells are coupled to the second bit line and the second bit line bar.

9. The apparatus of claim 8, wherein
at least one interconnection structure couples with the first bit line and the second bit line; and
at least another one interconnection structure that spans the first tier and the second tier couples with the first bit line bar and the second bit line bar.

10. The apparatus of claim 8, wherein the second bit line is vertically above the first bit line, the second bit line bar is vertically above the first bit line bar.

11. The apparatus of claim 8, wherein at least one memory bit cell of the first portion of the column of memory bit cells is vertically below at least one memory bit cell of the second portion of the column of memory bit cells.

12. An apparatus, comprising:
a peripheral tier;
a first tier on a first substrate and a second tier on a second substrate vertically stacked on the peripheral tier;
an interconnection structure that electrically connects the first substrate to the second substrate, and couples to a first bit line coupled to memory bit cells in the first tier and to a second bit line coupled to memory bit cells in the second tier; and
a plurality of memory slices, each of the plurality of memory slices comprising:
a first portion of a column of memory bit cells in the first tier; and
a second portion of the column of memory bit cells in the second tier;
wherein the peripheral tier is configured to regulate memory cell addresses by a BL-BLB pair coupled to at least one of the plurality of memory slices.

13. The apparatus of claim 12, wherein the peripheral tier is configured to regulate memory cell addresses by word lines coupled to at least one of the plurality of memory slices.

14. The apparatus of claim 13, wherein the word lines include a first word line and a second word line;
the first word line couples to at least one memory bit cells in at least one of the plurality of memory slices in the first tier; and
the second word line couples to at least one memory bit cells in at least one of the plurality of memory slices in the second tier.

15. The apparatus of claim 14, wherein a first segment of one of the first word line and the second word line is disposed to extend in a first direction, a second segment of one of the first word line and the second word line is disposed to extend in a second direction different from the first direction.

16. The apparatus of claim 15, wherein the first segment of one of the first word line and the second word line is in parallel with the BL-BLB pair.

17. The apparatus of claim 16, wherein the second segment of one of the first word line and the second word line is perpendicular to the BL-BLB pair.

18. The apparatus of claim 13, further comprising a pattern of conductive connections configured to connect with the word lines and the BL-BLB pair the conductive connections being disposed on a first substrate of the peripheral tier.

19. The apparatus of claim 18, wherein the pattern of conductive connections of the BL-BLB pair are sandwiched by the conductive connections of the word lines in a third direction.

20. The apparatus of claim 18, wherein the pattern of conductive connections of the word lines are sandwiched by the conductive connections of the BL-BLB pair in a third direction.

* * * * *